(12) United States Patent
Farris et al.

(10) Patent No.: US 8,062,039 B2
(45) Date of Patent: Nov. 22, 2011

(54) ADJUSTABLE TEST SOCKET

(75) Inventors: Jason W. Farris, Overland Park, KS (US); David W. Henry, Platte City, MO (US); Joseph J. Caven, Kansas City, MO (US); Donald A. Marx, Olathe, KS (US)

(73) Assignee: Interconnect Devices, Inc., Kansas City, KS (US)

( * ) Notice: Subject to any disclaimer, the term of this patent is extended or adjusted under 35 U.S.C. 154(b) by 14 days.

(21) Appl. No.: 12/398,695

(22) Filed: Mar. 5, 2009

(65) Prior Publication Data

US 2009/0227125 A1    Sep. 10, 2009

Related U.S. Application Data

(63) Continuation of application No. 11/715,712, filed on Mar. 8, 2007, now Pat. No. 7,581,962.

(60) Provisional application No. 60/780,448, filed on Mar. 8, 2006.

(51) Int. Cl.
*H01R 12/00* (2006.01)
(52) U.S. Cl. .......................................................... 439/71
(58) Field of Classification Search .......... 439/246–248, 439/71, 525, 526, 312, 73, 330, 331, 350
See application file for complete search history.

(56) References Cited

U.S. PATENT DOCUMENTS

| 2,092,904 | A | * | 9/1937 | Brugger ................... 439/312 |
| 5,068,601 | A | * | 11/1991 | Parmenter ................ 439/482 |
| 5,919,050 | A | * | 7/1999 | Kehley et al. ............ 439/71 |

* cited by examiner

*Primary Examiner* — Felix O Figueroa
(74) *Attorney, Agent, or Firm* — Finnegan, Henderson, Farabow, Garrett & Dunner LLP

(57) ABSTRACT

An adjustable test socket for aligning an electronic device with spring probes in a test fixture is provided having two adjustable walls or four adjustable walls.

12 Claims, 5 Drawing Sheets

US 8,062,039 B2

ADJUSTABLE TEST SOCKET

CROSS-REFERENCE TO RELATED APPLICATION

This application is a continuation of and claims priority to U.S. patent application Ser. No. 11/715,712, filed Mar. 8, 2007, which claims domestic priority from U.S. Provisional Application Serial No. 60/780,448, filed Mar. 8, 2006, entitled ADJUSTABLE TEST SOCKET. Each above-identified application is incorporated by reference herein, in its entirety, for all purposes.

FIELD OF THE INVENTION

The present invention relates to test socket assemblies and, more particularly, to test socket assemblies for temporarily connecting the conductive pads of an electronic device to an electronic test fixture during a test and evaluation procedure.

BACKGROUND OF THE INVENTION

Test sockets for the semi-conductor industry revolve around being able to guarantee contact between the spring probes in the test socket and the device pad/ball. It has become increasingly difficult to guarantee contact because of the variance in the package size of a chip and the variance of the pitch between the pads on the chip, along with the increased density of pads. A variety of errors may be reported for a tested device due to one or more probes contacting the wrong pad(s), contacting the edge of a pad resulting in poor contact between a test probe and pad, or a test probe simply missing the target pad all together. As a result, perfectly good devices may be rejected as defective driving up the cost of manufacturing or the end product.

SUMMARY OF THE INVENTION

A two- and four-wall adjustable test socket compensates for device tolerances to increase the ability to guarantee contact between the spring probes of the test fixture and the device pads. The two-wall adjustable test socket effectively cuts the outside device tolerance in half by presenting a device pocket which has a fixed corner dimensional to a particular device's nominal size, and two adjustable side walls to control the X dimension and Y dimension of the pocket.

The four-wall adjustable test socket presents a device which has four adjustable device pocket walls. The walls move in and out together to center the device within the device pocket and thereby compensate for device variances.

DETAILED DESCRIPTION

Figure 1:
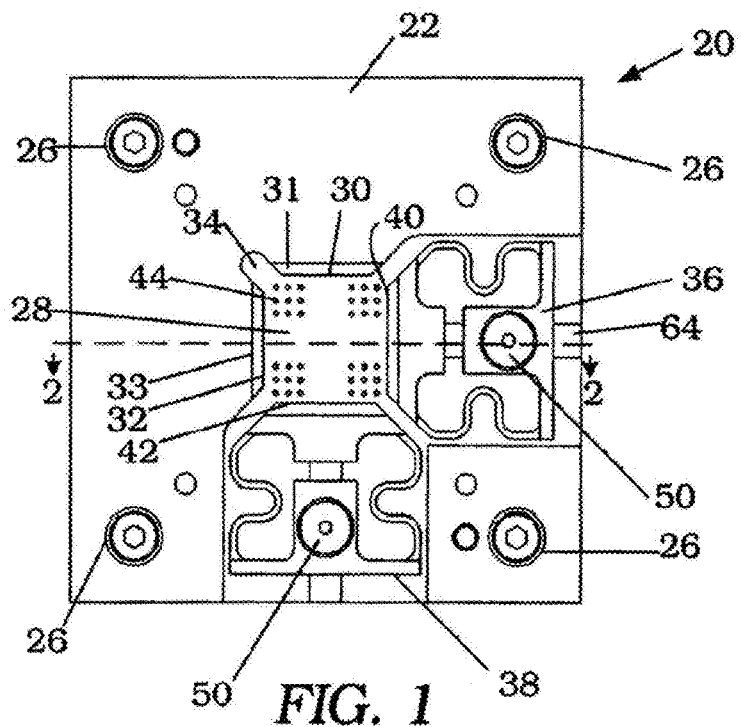
FIG. 1 is a plan view of a two-wall adjustable test socket.
Figure 2:
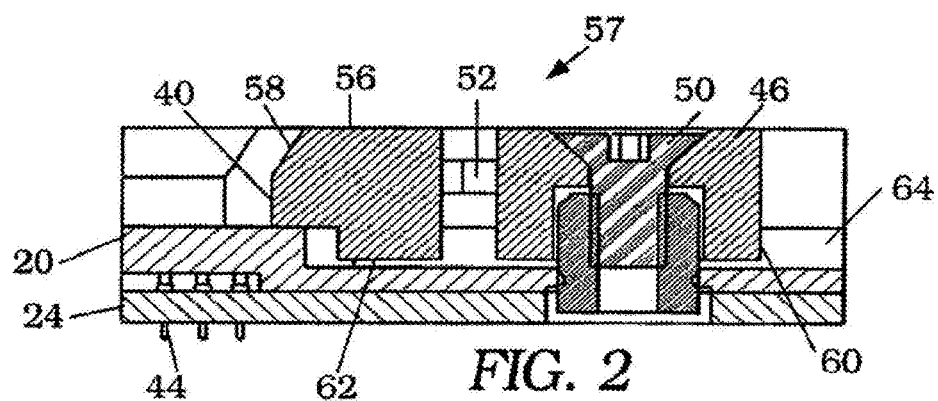
FIG. 2 is an enlarged partial sectional view of an adjustable wall member of FIG. 1 along line 2-2.
Figure 3:
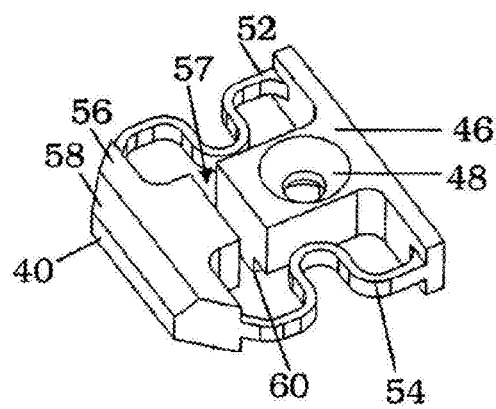
FIG. 3 is an enlarged perspective view of an adjustable wall member of FIG. 1.
Figure 4:
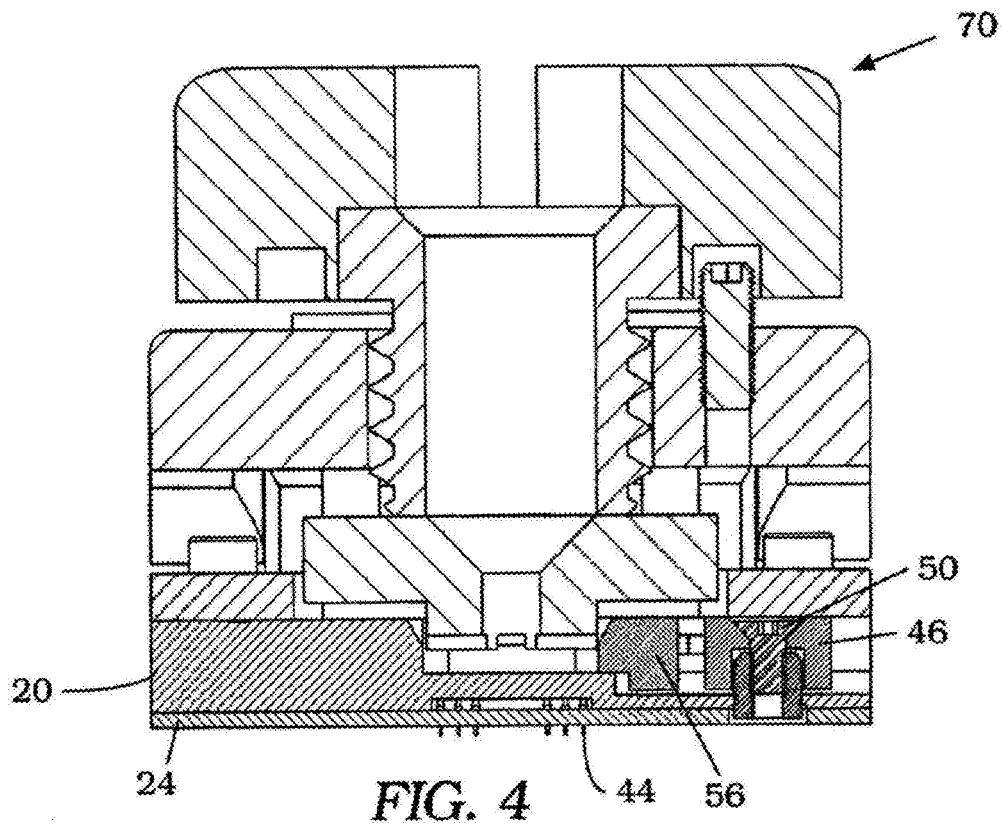
FIG. 4 is an enlarged sectional view of a test fixture with the two-wall adjustable test socket of FIG. 2.
Figure 5:
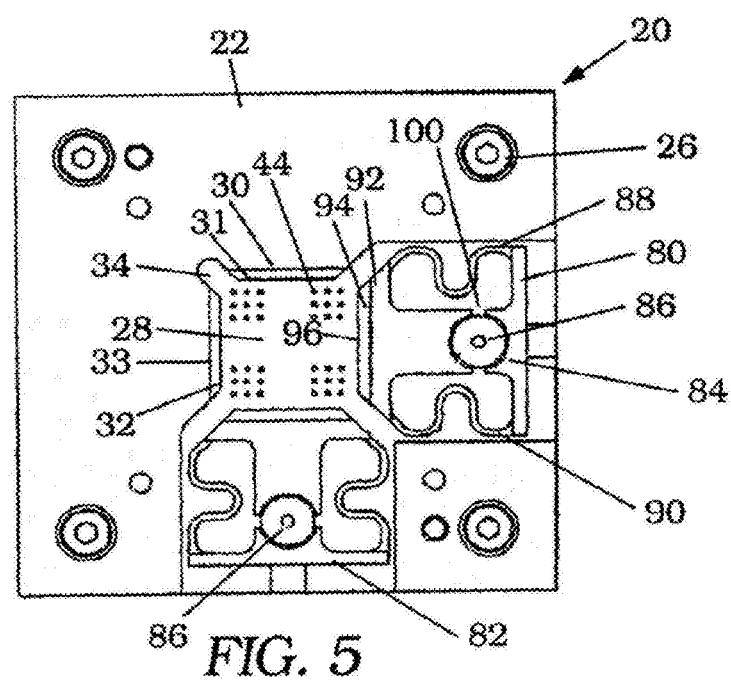
FIG. 5 is another embodiment of the two-wall adjustable test socket.
Figure 6:
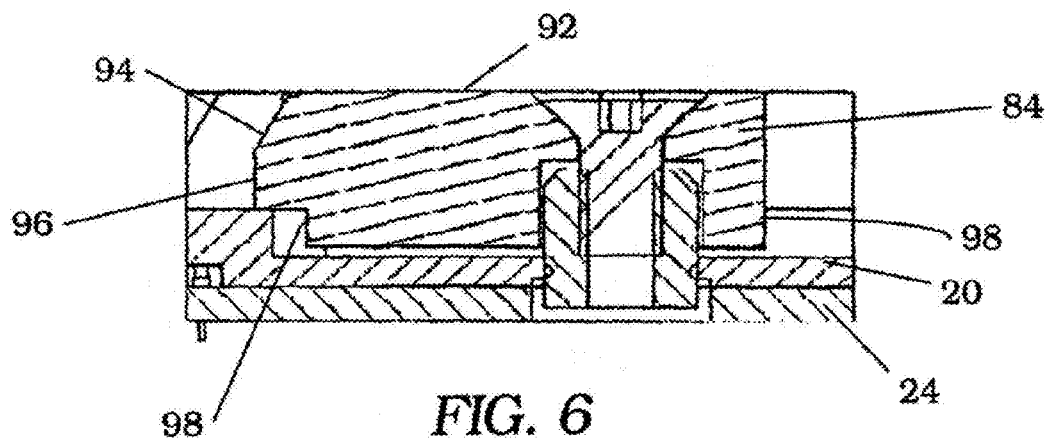
FIG. 6 is an enlarged partial sectional view of an adjustable wall member of FIG. 5 along line 6-6.
Figure 7:
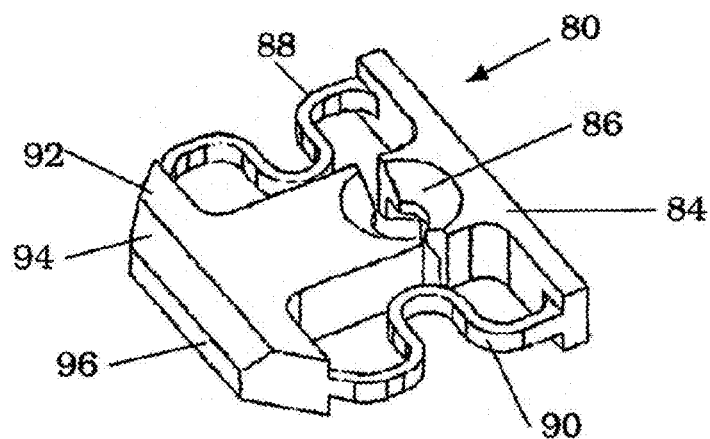
FIG. 7 is an enlarged perspective view of an adjustable wall member of FIG. 5.
Figure 8:
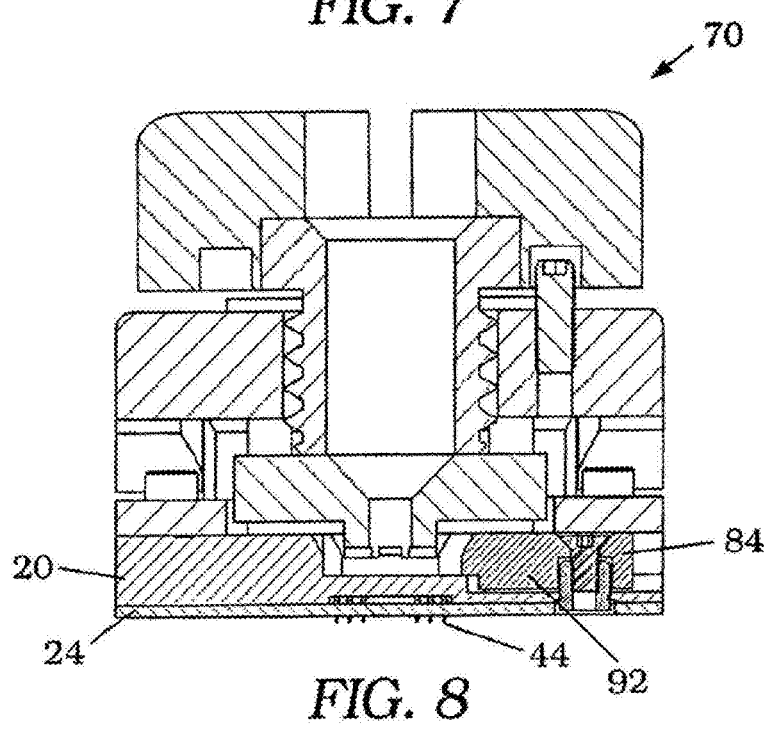
FIG. 8 is an enlarged sectional view of a test texture with the two-wall adjustable test socket of FIG. 6.

Referring initially to FIGS. 1-4 a two-wall adjustable test socket of the present invention is generally indicated by reference numeral 20. The two-wall adjustable test socket 20 includes a mounting plate 22 which is secured to a test fixture plate 24 by fasteners 26 in each corner of the mounting plate 22. The mounting plate 22 includes a device pocket 28 formed by two fixed sides 30 and 32 each having a beveled surface 31 and 33, respectively, to present a fixed corner 34, and two adjustable wall members 36 and 38 which present device pocket walls 40 and 42, respectively. Extending through the bottom of the test fixture plate 24 aligned with the device pocket 28 are arrays of spring probes 44 which are positioned to be aligned with the device pads (not shown).

The adjustable wall members 36 and 38 are identical and will be described in detail referring to adjustable wall member 36. Adjustable wall member 36 includes a base 46 which has an aperture 48 for a fastener 50 for securing the adjustable wall member 36 to the mounting plate 22, a pair of compliant members 52 and 54 extending from base 46, and a nose 56 which includes a beveled surface 58 and the device pocket wall 40. The nose 56 is separated from the base 46 by a gap 57 which allows the adjustable wall member 36 to automatically adjust for varying device sizes. The adjustable wall member 36 also includes a rail or guide ridge 60 and 62 on the lower surface of the base 46 and nose 56, respectively, which fits into an alignment groove 62 in mounting plate 22.

The adjustable wall members 36 and 38 are adjusted to the optimal location according to the dimensions of a particular device under test and then secured in place by tightening the fasteners 50. In operation, the text fixture 70 presses an electronic device (not shown) into the device pocket 28 of the adjustable test socket 20. The beveled surfaces 31, 33 and 58 of the pocket sides 30, 32, 40 and 42 guide the electronic device into the device pocket 28 and into alignment with the spring probes 44. The compliant members 52 and 54 ensure that the electronic device is urged into the fixed corner 34 of the mounting plate 22. By forcing the device into the fixed corner 34, the variances in the device package and the location of the device pads can be accurately managed to improve the likelihood of contact between the device and the spring probes 44 of the test fixture 70.

Referring to FIGS. 5-8, another embodiment of a two-wall adjustable test socket is generally indicated by reference numeral 20. The two-wall adjustable test socket 20 includes basically the same components as set forth above for the first embodiment except for the adjustable wall members 80 and 82, which are discussed below in detail.

The adjustable wall members 80 and 82 are identical and will be described in detail referring to adjustable wall member 80. Adjustable wall member 80 includes a base 84 which has an aperture 86 for a fastener 50 for securing the adjustable wall member 80 to the mounting plate 22, a pair of compliant members 88 and 90, and a nose 92 which includes a beveled surface 94 and a device pocket wall 96. Along the lower surface, a rail 98 extends from the base 84 to the nose 92 and fits into the alignment groove 62 in mounting plate 22. The aperture 86 is countersunk and includes a lateral split or channel 100. When a fastener 50 is inserted into the aperture 86 and tightened, the head of the fastener 50 forces the nose 92 away from the base 84. The adjustable wall member 80 is aligned in the groove 62 and is adjusted inwardly or outwardly as necessary. In this manner, the wall members 80 and 82 are adjusted to properly size the device pocket 28 for a particular electronic device. When the fastener 50 is loosened, the compliant members 88 and 90 pull the nose 92 back towards the base 84.

Figure 9:
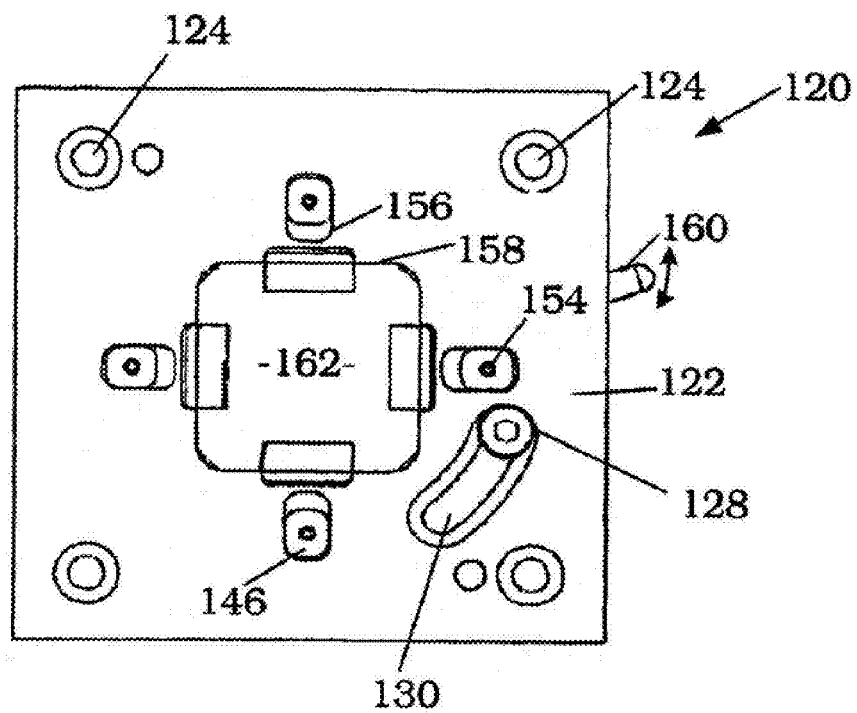
FIG. 9 is a top plan view of a four-wall adjustable test socket.
Figure 10:
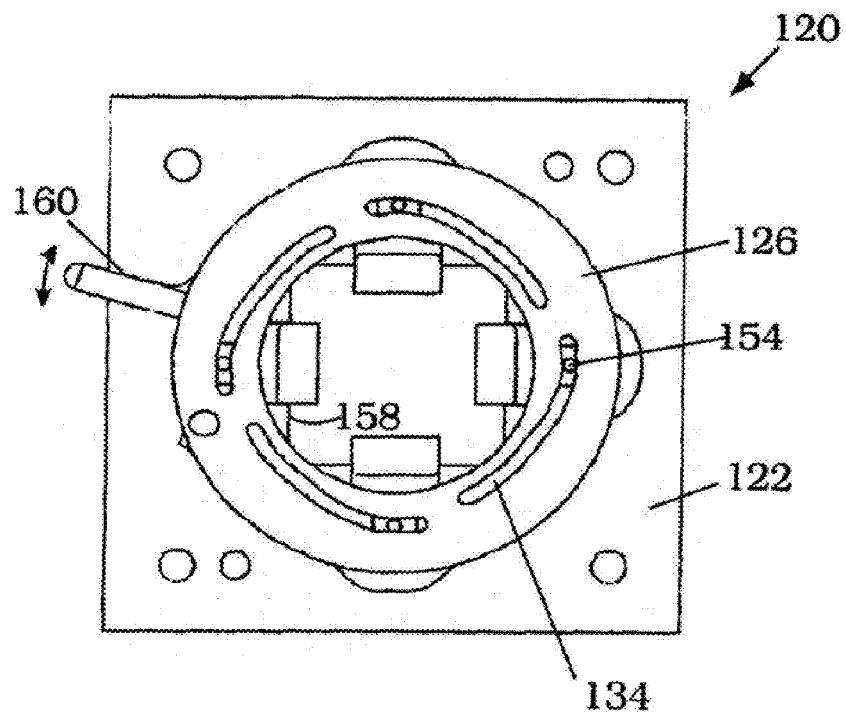
FIG. 10 is a bottom plan view of the four-wall adjustable test socket of FIG. 7.
Figure 11:
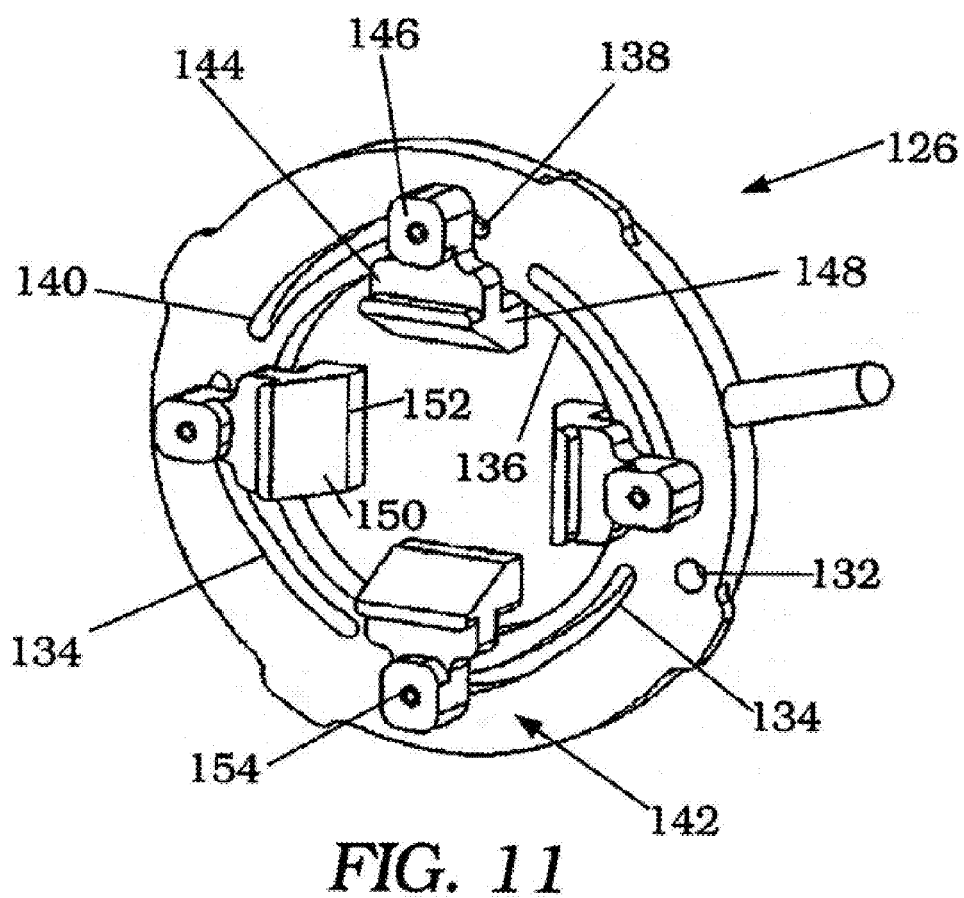
FIG. 11 is an enlarged perspective view of the wall members and adjusting cam.

Referring to FIGS. 9-11, a four-wall adjustable test socket assembly is generally indicated by reference numeral 120. Four-wall adjustable test socket assembly 120 includes a base plate 122 which is secured to the test fixture plate 24 by fasteners 124 in each corner of the base plate 122. A cam ring plate 126 is adjustably secured to the base plate 122. A cam ring plate 126 is adjustably secured to the base plate 122 by a fastener 128 which extends through an arcuate slot 130 in base plate 122 to an aperture 132 in cam ring plate 126. Cam ring plate 126 includes four cam profile arcuate slots 134 which are evenly spaced around the cam ring plate 126 and curve inwardly toward the inner edge 136 of the cam ring plate 126 so that a first end 138 of the cam profile arcuate slot 134 is radially spaced farther from the inner edge 136 than a second end 140 of the cam profile arcuate slot 134. In other words, each cam profile arcuate slot 134 follows an inward spiral toward the center of the cam ring plate 126.

The cam ring plate 126 includes four adjustable wall members 142. Each adjustable wall member 1452 includes a base 144 with a raised alignment stud 146, and a nose 148 with a beveled surface 150 extending to a pocket wall 152.

A dowel pin 154 extends through the raised alignment stud 146 of each adjustable wall member 142 through the base 144. The dowel pin 154 extends beyond the lower surface of the base 144 so that it can be inserted into the cam profile arcuate slot 134. The diameter of the dowel pin is approximately equal to the width of the cam profile arcuate slot 134.

When the four-wall adjustable test socket 120 is assembled, the four adjustable wall members 142 are captured between the cam ring 126 and the base plate 122. The raised alignment studs 146 extend through rectangular slots 156 in the base plate 122. The rectangular slots 156 are spaced 90 degrees apart and extend radially outwardly from a device pocket opening 158 in the base plate 122. The device pocket opening 158 is generally square and is centered in the base plate 122. It should be understood that the device pocket opening may be any shape as necessary to accommodate the periphery of an electronic device to be tested (not shown). An adjustment handle 160 attached to the outer periphery of the cam ring plate 126 extends beyond the periphery of the base plate 122.

When fastener 128 is loose, the adjustment handle may be moved between a first position in which the adjustable wall members 142 are fully retracted, and a second position in which the adjustable wall members 142 are fully extended. In the retracted position, the device pocket 162 is the maximum size. In the extended position, the device pocket 162 is the minimum size.

As the adjustment handle 160 is moved, the dowel pins 154 follow cam profile arcuate slots 134 and the raised alignment studs 146 slide within the rectangular slots 156. The rectangular slots 156 guide the adjustable wall members 142 radially inwardly and outwardly. The adjustable wall members 142 move in unison to keep the electronic device aligned and centered within the device pocket 162. When the adjustment handle 160 is rotated to the desired position, the fastener 128 is tightened to prevent the cam plate 126 from rotating and thereby locking the position of the adjustable wall members 142.

Having thus described the invention, what is claimed as new and desired to be secured by Letters Patent is:

1. A four-wall adjustable test socket for aligning an electronic device with an array of spring probes mounted in a test fixture plate, the four-wall adjustable test socket comprising:
    a base plate secured to the test fixture plate;
    a cam ring plate adjustably secured to the base plate, wherein the cam ring plate comprises:
    a plurality of cam profile arcuate slots evenly positioned around the cam ring plate, wherein each cam profile arcuate slot defines a passageway through the cam ring plate, and
    four adjustable wall members comprising at least a first wall member and a second wall member, wherein each adjustable wall member comprises a base and a nose, the first wall member comprising a first nose and the second wall member comprising a second nose, wherein each adjustable wall member is positioned between the base plate and the cam ring plate;
    wherein the cam ring plate and the first wall member and the second wall member are configured such that a rotation of the cam ring plate relative to at least the first wall member causes a separation between the first nose and the second nose to vary as a function of the rotation.

2. The four-wall adjustable test socket of claim 1, wherein the base plate is secured to the test fixture plate via a plurality of fasteners, wherein each fastener is located in a corner of the base plate.

3. The four-wall adjustable test socket of claim 1, wherein the cam ring plate is adjustably secured to the base plate via a fastener extending through an arcuate slot in the base plate to an aperture in the cam ring plate.

4. The four-wall adjustable test socket of claim 1, wherein at least one of the plurality of cam profile arcuate slots curve inwardly toward an inner edge of the cam ring plate wherein a first end of the cam profile arcuate slot is radially spaced farther from the inner edge than a second end of the cam profile arcuate slot.

5. The four-wall adjustable test socket of claim 1, wherein the nose of each adjustable wall member comprises a beveled surface extending to a pocket wall.

6. The four-wall adjustable test socket of claim 1, wherein the base of each adjustable wall member comprises a raised alignment stud.

7. The four-wall adjustable test socket of claim 6, wherein the base of each adjustable wall member comprises a dowel pin that extends through the raised alignment stud and beyond a lower surface of the base.

8. The four-wall adjustable test socket of claim 7, wherein a diameter of the dowel pin is approximately equal to a width of at least one of the cam profile arcuate slots.

9. The four-wall adjustable test socket of claim 7, further comprising:
    an adjustment handle attached to the cam ring plate, wherein the adjustment handle is configured to control a position of one or more of the adjustable wall members.

10. The four-wall adjustable test socket of claim 7, wherein the base plate comprises a plurality of rectangular slots that extend radially outwardly from a device pocket opening in the base plate, wherein a raised alignment stud extends through one of the plurality of rectangular slots.

11. The four-wall adjustable test socket of claim 10, wherein the adjustment handle is configured to move between a first position and a second position, wherein when the handle is in a first position, each of the adjustable wall members is fully retracted and a device pocket has a first size, wherein when the handle is in a second position, each of the adjustable wall members is fully extended and the device pocket has a second size, wherein the first size is larger than the second size.

12. The four-wall adjustable test socket of claim 10, wherein the adjustment handle is configured to be moved between a first position and a second position, wherein movement of the adjustment handle positions one or more of the adjustable wall members, wherein the one or more adjustable wall members define a device pocket.

* * * * *